United States Patent
Ma et al.

(10) Patent No.: US 6,627,503 B2
(45) Date of Patent: Sep. 30, 2003

(54) METHOD OF FORMING A MULTILAYER DIELECTRIC STACK

(75) Inventors: Yanjun Ma, Vancouver, WA (US); Yoshi Ono, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/137,567

(22) Filed: Apr. 30, 2002

(65) Prior Publication Data

US 2002/0130340 A1 Sep. 19, 2002

Related U.S. Application Data

(62) Division of application No. 09/502,420, filed on Feb. 11, 2000, now Pat. No. 6,407,435.

(51) Int. Cl.[7] .............................................. H01L 21/336
(52) U.S. Cl. ........................ 438/287; 438/261; 438/785
(58) Field of Search ................... 438/216, 261, 438/287, 761, 763, 778, 785

(56) References Cited

U.S. PATENT DOCUMENTS

| | | | | |
|---|---|---|---|---|
| 4,545,115 A | * | 10/1985 | Bauer et al. | 438/570 |
| 5,195,018 A | * | 3/1993 | Kwon et al. | 361/313 |
| 5,508,092 A | * | 4/1996 | Kimock et al. | 428/216 |
| 5,646,583 A | * | 7/1997 | Seabury et al. | 333/187 |
| 5,742,471 A | * | 4/1998 | Barbee et al. | 361/312 |
| 6,015,739 A | * | 1/2000 | Gardner et al. | 438/287 |
| 6,335,240 B1 | * | 1/2002 | Kim et al. | 438/253 |

OTHER PUBLICATIONS

Copel et al, "Structure and stability of ultrathin zirconium oxide layers on Si(100)", Jan. 2000, Applied Physics Letters, vol. 76, No. 4, p. 436–438.*

* cited by examiner

*Primary Examiner*—Amir Zarabian
*Assistant Examiner*—Jamie L. Brophy
(74) *Attorney, Agent, or Firm*—Matthew D. Rabdau; David C. Ripma; Scott C. Krieger

(57) ABSTRACT

A multilayer dielectric stack is provided which has alternating layers of a high-k material and an interposing material. The presence of the interposing material and the thinness of the high-k material layers reduces or eliminate effects of crystallization within the high-k material, even at relatively high annealing temperatures. The high-k dielectric layers are a metal oxide of preferably zirconium or hafnium. The interposing layers are preferably amorphous aluminum oxide, aluminum nitride, or silicon nitride. Because the layers reduce the effects of crystalline structures within individual layers, the overall tunneling current is reduced. Also provided are atomic layer deposition, sputtering, and evaporation as methods of depositing desired materials for forming the above-mentioned multilayer dielectric stack.

13 Claims, 4 Drawing Sheets

METHOD OF FORMING A MULTILAYER DIELECTRIC STACK

CROSS REFERENCE TO RELATED APPLICATIONS

This application is a divisional of application Ser. No. 09/502,420, filed Feb. 11, 2000, entitled "Multilayer Dielectric Stack and Method," invented by Yanjun Ma and Yoshi Ono, now U.S. Pat. No. 6,407,435.

BACKGROUND OF THE INVENTION

The present invention relates generally to integrated circuit (IC) fabrication processes and, more particularly, to a multilayer dielectric stack, and a method for producing such a stack.

Current Si VLSI technology uses $SiO_2$ as the gate dielectric in MOS devices. As device dimensions continue to scale down, the thickness of the $SiO_2$ layer must also decrease to maintain the same capacitance between the gate and channel regions. Thicknesses of less than 2 nanometers (nm) are expected in the future. However, the occurrence of high tunneling current through such thin layers of $SiO_2$ requires that alternate materials be considered. Materials with high dielectric constants would permit gate dielectric layers to be made thicker, and so alleviate the tunneling current problem. These so-called high-k dielectric films are defined herein as having a high dielectric constant relative to silicon dioxide. Typically, silicon dioxide has a dielectric constant of approximately 4, while it would be desirable to use a gate dielectric material with a dielectric constant of greater than approximately 10.

One common problem associated with the above-mentioned high-k dielectrics is that they develop a crystalline structure under normal integrated circuit manufacturing conditions. As a result, the surface of the film is very rough. Surface roughness causes non-uniform electrical fields in the channel region adjacent the dielectric film. Such films are not suitable for the gate dielectrics of MOSFET devices.

Because of high direct tunneling currents, $SiO_2$ films thinner than 1.5 nm generally cannot be used as the gate dielectric in CMOS devices. There are currently intense efforts in the search for the replacement of $SiO_2$, with $TiO_2$ and $Ta_2O_5$ attracting the greatest attention. However, high temperature post deposition annealing, and the formation of an interfacial $SiO_2$ layer, make achieving equivalent $SiO_2$ thicknesses, also known as equivalent oxide thickness (EOT), of less than 1.5 nm very difficult.

It would be advantageous if an alternative dielectric that alleviated concerns about thin oxide films without degrading overall performance or increasing tunneling current could be used.

It would be advantageous if a high-k dielectric film could be used as an insulating barrier between a gate electrode and the underlying channel region in a MOS transistor.

It would be advantageous if high-k dielectric films could be formed with reduced surface roughness, crystallinity, and electrical leakage. It would be advantageous if these non-crystalline high dielectric constant materials could be used in gate dielectrics and storage capacitors of integrated circuits.

SUMMARY OF THE INVENTION

Accordingly, a multilayer dielectric stack composed of alternating layers of high-k material, which have high dielectric constants relative to silicon, and interposing material is provided. The high-k material is selected from titanium oxide ($TiO_2$), zirconium oxide ($ZrO_2$), hafnium oxide ($HfO_2$), tantalum oxide ($Ta_2O_5$), and barium and strontium titanium oxide (($Ba,Sr)TiO_3$), preferably zirconium oxide or hafnium oxide. The interposing material is selected from aluminum oxide ($Al_2O_3$), aluminum nitride (AlN), silicon nitride (SiN or $Si_3N_4$), or silicon dioxide ($SiO_2$), preferably aluminum oxide, aluminum nitride or silicon nitride.

Preferably, alternating layers of high-k material and interposing material replace prior art silicon dioxide dielectric layers in integrated circuits. Each layer is preferably between less than 50 angstroms thick. The thin layers of high-k material bounded by interposing material reduces or eliminates the formation of crystalline structures. The multiple layers reduce the tunneling current, which allows for better device performance. For a fixed total height, additional layers will reduce tunneling current. The overall capacitance of a given height stack will vary depending upon the dielectric constant of both the interposing material and the high-k material. The number of layers for a desired total thickness will be limited by the minimum thickness obtainable for each layer, and the device characteristics desired.

Also provided is an integrated circuit (IC) structure for an IC comprising a multilayer dielectric stack having a first layer of dielectric material overlying a semiconductor substrate, a second layer of dielectric material overlying the first layer, a third layer composed of the same material as the first layer overlying the second layer, and an electrode overlying the dielectric stack. The content of the dielectric stack is as described above. The overall thickness of the dielectric stack is preferably between 20 and 200 angstroms.

In another embodiment of the present invention, the integrated circuit structure is a MOS transistor comprising a gate electrode, a channel region having a top surface underlying the gate electrode, and a gate dielectric stack, which comprises a first dielectric layer comprising a first dielectric material, a second dielectric layer comprising a second dielectric material, and a third dielectric layer comprising the same material as the first dielectric layer, interposed between the gate electrode and the channel region top surface.

Some aspects of the invention further comprise an oxidation barrier interposed between the silicon substrate and the dielectric stack to prevent oxygen from migrating into the silicon substrate beneath the dielectric stack. The interface material is selected from the group consisting of aluminum nitride, silicon nitride, and silicon oxynitride.

In the fabrication of an IC on a semiconductor substrate having an upper surface, a method is provided to form a multilayer dielectric stack on the semiconductor substrate. The method comprises the steps of:

a) forming a first dielectric layer on the upper surface of the semiconductor substrate;

b) forming a second dielectric layer on the first dielectric layer; and c) forming a third dielectric layer above the second dielectric layer, wherein the third dielectric layer comprises the same dielectric material as the first dielectric material.

Preferably, each dielectric layer is formed by atomic layer deposition, which is sometimes referred to as pulsed CVD, of a precursor followed by oxidation of the precursor to form the desired oxide material. Although atomic layer deposition is preferred, alternative methods of depositing each dielectric layer include sputtering and evaporation.

Following deposition of multiple dielectric layers, the entire dielectric stack is preferably annealed at temperatures between approximately 400 and 900 degrees Celsius to condition the stack, the interfaces between the layers, and the interface with the substrate.

Subsequent processing can be performed to complete the formation of the IC, including depositing an electrode layer and patterning the electrode layer and underlying multiple dielectric layers to form a multilayer dielectric stack structure.

DETAILED DESCRIPTION OF THE INVENTION

Figure 1:
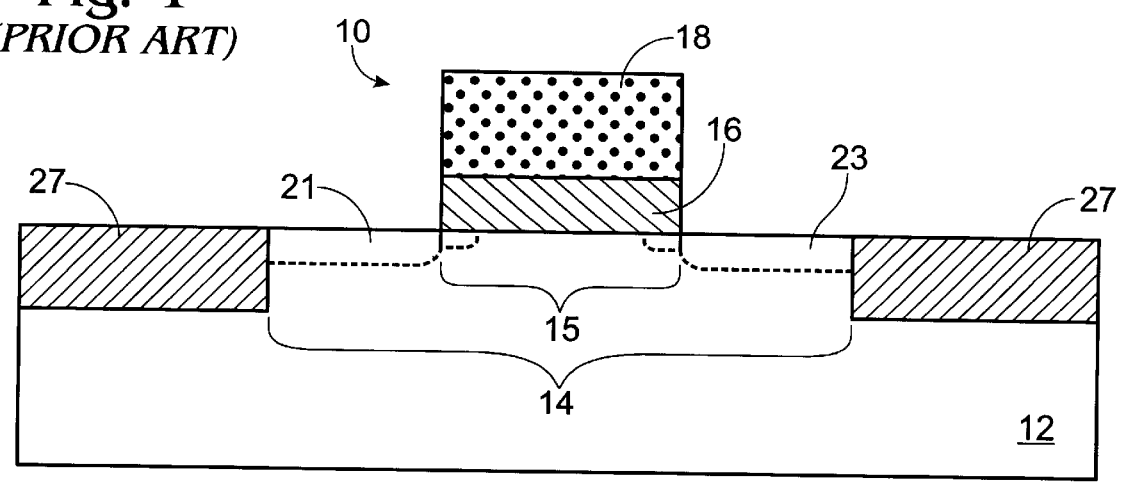
FIG. 1 is a schematic cross-sectional view showing an integrated circuit structure with a silicon dioxide dielectric layer (prior art).

Referring now to the drawings, which are for illustration purposes (not to scale), FIG. 1 shows a common prior art integrated circuit (IC) structure, specifically a MOS transistor gate structure 10. MOS transistor gate structure 10 formed on a semiconductor substrate 12 above an active area 14 containing a channel region 15. MOS transistor gate structure 10 has a silicon dioxide dielectric layer 16 located above channel region 15 having a width. An electrode 18, which is typically doped polysilicon, is formed above the dielectric layer 16 to complete the gate structure 10.

A completed MOS transistor will also include source region 21, drain region 23 and field isolation region 27, which are illustrated in FIG. 1 and in some other figures. But, these features will not be further described or identified as they are well known to those skilled in the art. Throughout the remainder of this description structures analogous to the MOS transistor gate structure 10 will often be referred to as an integrated circuit structure to emphasis the applicability of the present invention to other device structures using dielectric materials.

As IC devices continue to shrink in size, the thickness of the silicon dioxide dielectric layer 16 must also get smaller to maintain the same capacitance level and other characteristics of the overall device. The "size" of IC devices generally refers to the length of the channel region 15. That length is generally equal to the length of the gate electrode 18 as it appears in FIG. 1. As the length continues to shrink the area of the channel region decreases. In order to maintain the capacitance, the thickness of the silicon dioxide layer must decrease. As the necessary thickness of the silicon dioxide dielectric layer becomes very thin, on the order of 20 angstroms, the presence of high tunneling current generally requires use of alternative materials. The alternative materials are referred to as "high-k" materials because they have a high dielectric constant relative to silicon dioxide. Current candidates for high-k materials include titanium oxide ($TiO_2$), zirconium oxide ($ZrO_2$), hafnium oxide ($HfO_2$), tantalum oxide ($Ta_2O_5$), and barium and strontium titanium oxide ($(Ba,Sr)TiO_3$). Unfortunately, these materials tend to develop polycrystalline structures under normal preparation conditions or subsequent process temperatures. These polycrystalline structures have been associated with increased leakage currents.

The present invention addresses these concerns by using alternating layers of high-k materials, and interposing materials. The interposing materials are preferably amorphous. Thin interposing layers separating thin high-k layers reduce or eliminate the formation of polycrystalline structures within the high-k layers. Since the interposing materials are amorphous, they tend to further reduce the amount of crystallization in the adjacent layers. Also by having thin high-k layers, any crystallization that may occur will produce relatively small crystal structures. Although amorphous interposing materials are preferred, single crystal materials, or materials having small polycrystalline structures are also within the scope of the present invention.

Figure 2:
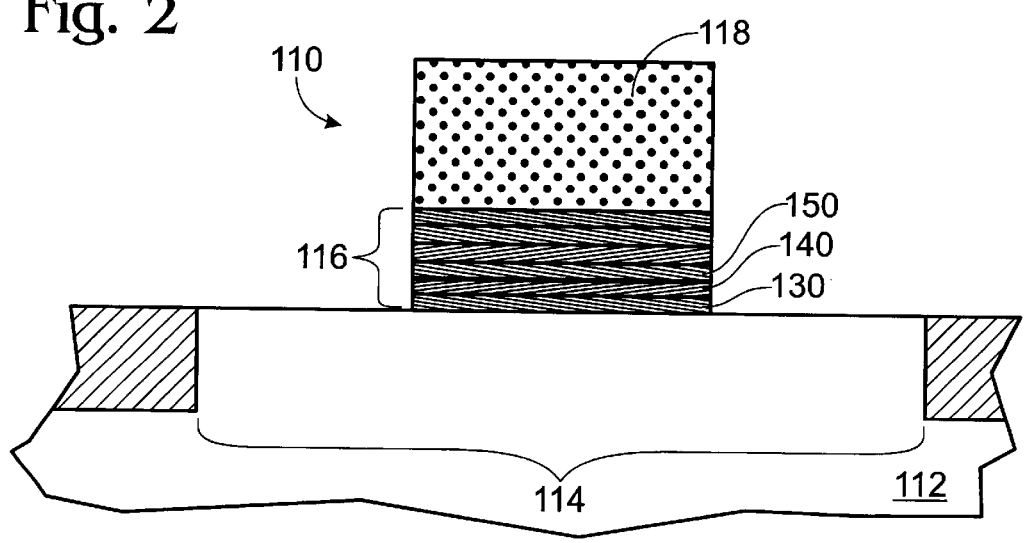
FIG. 2 is a schematic cross-sectional view showing an integrated circuit structure with a multilayer dielectric stack.

Referring now to FIG. 2, a integrated circuit structure 110 is formed over an active region 114 of an semiconductor substrate 112. The integrated circuit structure has a multilayer dielectric stack 116 that replaces silicon dioxide dielectric layer 16, shown in FIG. 1. The multilayer dielectric stack has an interposing layer 130 above the active region 114, and a high-k layer 140 above interposing layer 130. Interposing layer 130 is composed of aluminum oxide ($Al_2O_3$), aluminum nitride (AlN), silicon nitride (SiN or $Si_3N_4$), or silicon dioxide ($SiO_2$), but preferably aluminum oxide. Interposing layer 130 is less than 50 angstroms thick. High-k layer 140 is composed of a high-k dielectric material. The high-k dielectric material is titanium oxide ($TiO_2$), zirconium oxide ($ZrO_2$), hafnium oxide ($HfO_2$), tantalum oxide ($Ta_2O_5$), or barium and strontium titanium oxide ($(Ba,Sr)TiO_3$), but preferably $ZrO_2$, or $HfO_2$. A second interposing layer 150 overlies the high-k layer 140 and is preferably composed of the same material as interposing layer 130. In a preferred embodiment of the present invention the layers will repeat, for example $Al_2O_3/ZrO_2/Al_2O_3/ZrO_2/Al_2O_3/ZrO_2$.

Figure 3:
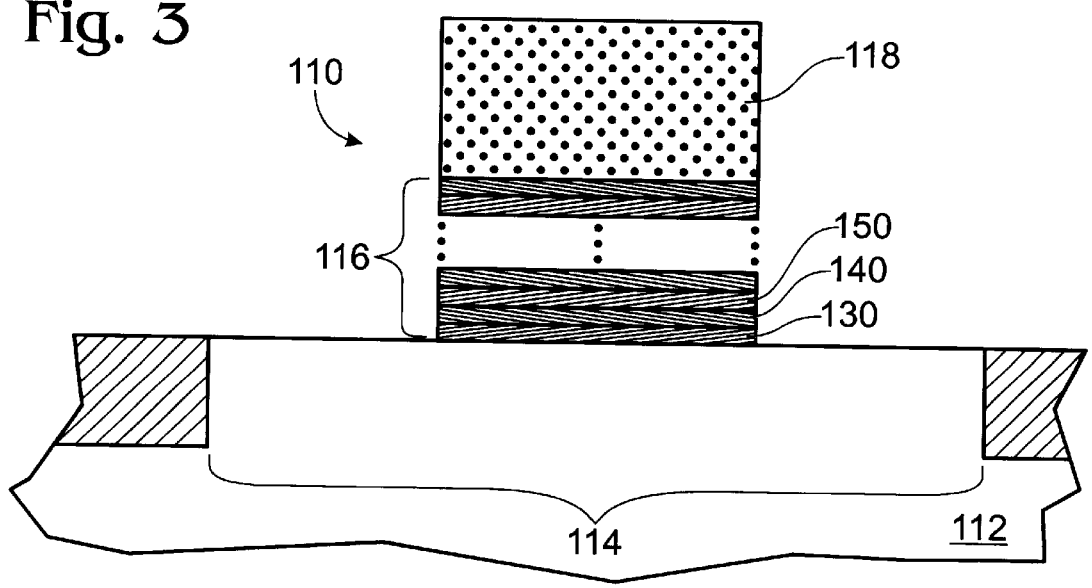
FIG. 3 is a schematic cross-sectional view illustrating that the number of layers in the multilayer dielectric stack can be varied.

As illustrated by FIG. 3 the number or pattern of layers could repeat many times. Each additional layer will tend to reduce the tunneling current of the multilayer dielectric stack, while at the same time reducing the overall capacitance. Since it is desirable to have a high capacitance with a low tunneling current, a balance will preferably be determined based on the desired performance of the IC device. It would also be possible to reverse the order of the materials such that high-k layer 140 would be deposited prior to interposing layer 130.

Although we have described an even number of layers above, it is also within the coverage of the present invention to have an extra layer as the topmost layer. The topmost layer can be selected to provide good interface with an electrode 118.

Figure 4:
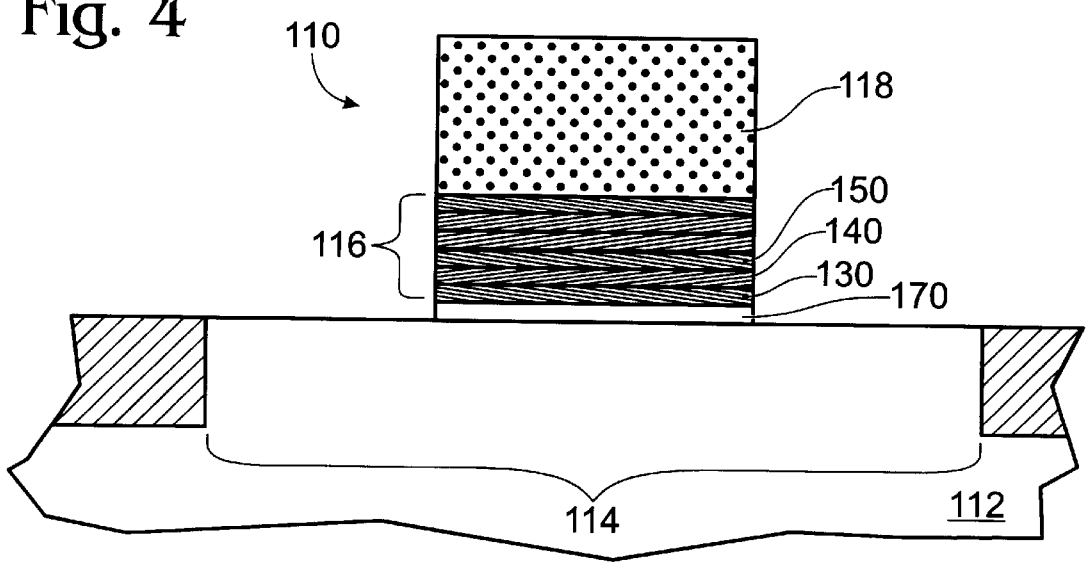
FIG. 4 is a schematic cross-sectional view showing an oxidation barrier interposed between a silicon substrate and the multilayer dielectric stack.

Interposing layer 130 is preferably chosen from a material that will act as an oxidation barrier to protect the underlying silicon. If interposing layer 130 will not act as an oxidation barrier, or if high-k layer 140 would otherwise be in contact with the underlying silicon substrate, an oxidation barrier 170 is provided between semiconductor substrate 112 and multilayer dielectric stack 116, as shown in FIG. 4. Materials that act as oxidation barriers, at the thicknesses required by the present invention, include aluminum oxide, silicon nitride and silicon oxynitride.

Figure 5:
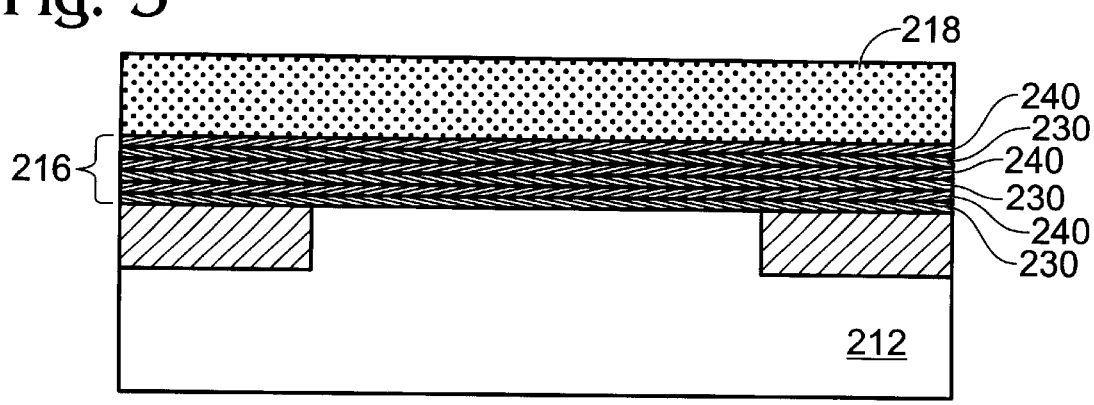
FIG. 5 is a schematic cross-sectional view showing an intermediate stage following deposition of multiple dielectric layers and an electrode layer.

FIG. 5 illustrates an embodiment of an intermediate stage in the production of an integrated circuit structure, with a multilayer dielectric stack 216 according to the present invention. Multiple alternating layers of high-k material 230 and interposing material 240 are deposited over an entire wafer 212 to form multilayer dielectric stack 216. Then an electrode layer 218 is also deposited over the entire wafer. Electrode layer 218 and underlying multilayer dielectric stack 216 is patterned and then etched to produce the integrated circuit structure shown in FIG. 2. Additional processes can be performed to produce junctions or other structures as desired.

Figure 6:
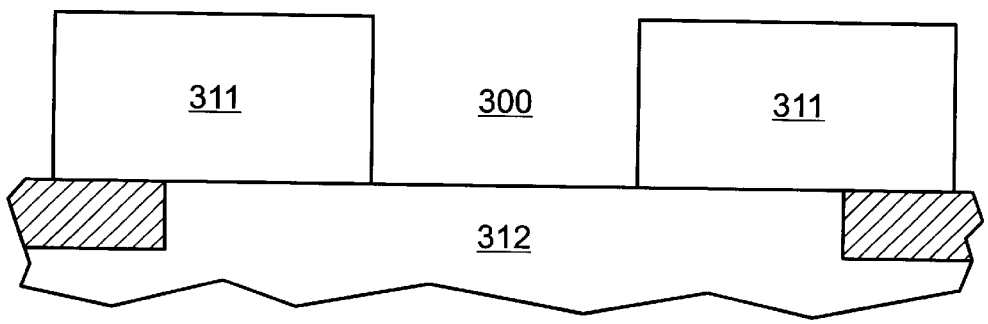
FIG. 6 is a schematic cross-sectional view showing an intermediate stage in the formation of a device according to the present invention utilizing a replacement gate method, which illustrates the structure after removal of the preliminary gate.

The multilayer dielectric stack of the present invention would also be suitable for use in connection with emerging substitute gate manufacturing methods. Substitute gates involve the formation of a preliminary gate structure, which is subsequently removed. After the preliminary gate structure is removed, an opening is left where the preliminary gate structure was. A final gate can then be formed in the opening. FIG. 6 shows a semiconductor substrate at an intermediate stage in the formation of a substitute gate. The preliminary gate structure has been removed to produce an opening 300 surrounded by a planarization material 311, which is preferably silicon dioxide or silicon nitride.

Figure 7:
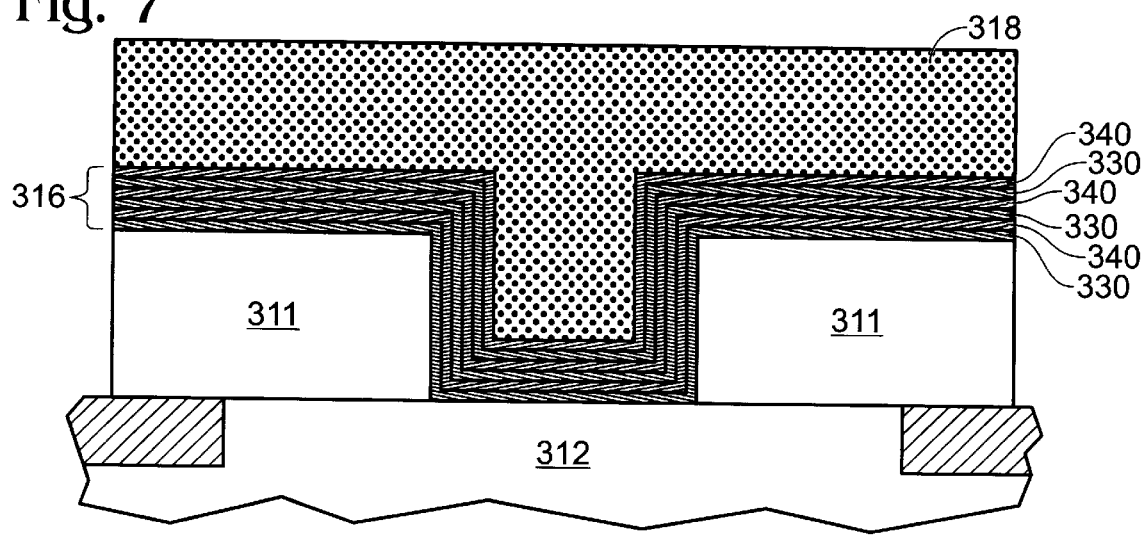
FIG. 7 is a schematic cross-sectional view showing an intermediate stage in the formation of a device according to the present invention utilizing a replacement gate method, which illustrates the structure after depositing multiple layers of dielectric material and a layer of electrode material.

FIG. 7 shows a subsequent stage wherein multiple dielectric stack layers 316, formed from alternating layers of interposing material 330 and high-k material 340, and an electrode layer 318 have been deposited over a semiconductor substrate 312 having opening for producing a substitute gate. The multilayer dielectric stack layers 316 and electrode layer 318 can be removed from areas where they overly the planarization material 311 by a chemical mechanical polish, or other suitable process, to produce a structure as shown in FIG. 8.

Figure 8:
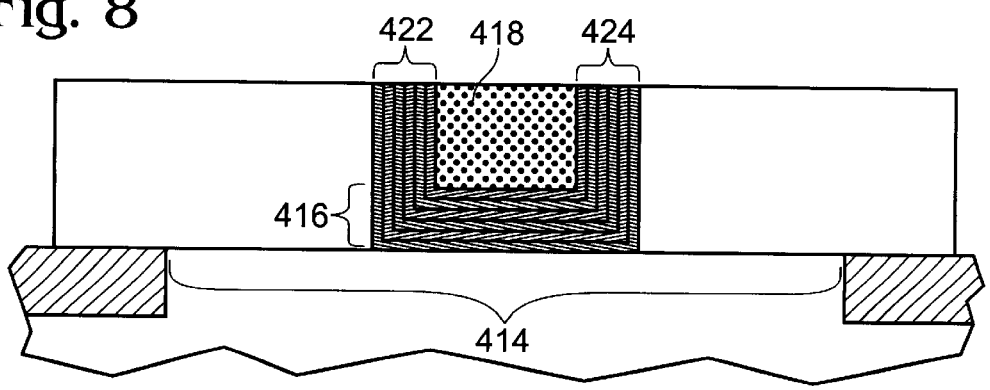
FIG. 8 is a schematic cross-sectional view showing the device of FIG. 7 following a planarization process to remove excess material.

FIG. 8 shows the present invention applied to a substitute gate structure. A multilayer dielectric stack 416 overlays an active area 414. During the formation of multilayer dielectric stack 416, multilayer sidewalls 422 and 424 were also produced. An electrode 418, preferably metal, overlays multilayer dielectric stack 416, between multilayer sidewall 422 and 424.

Figure 9:
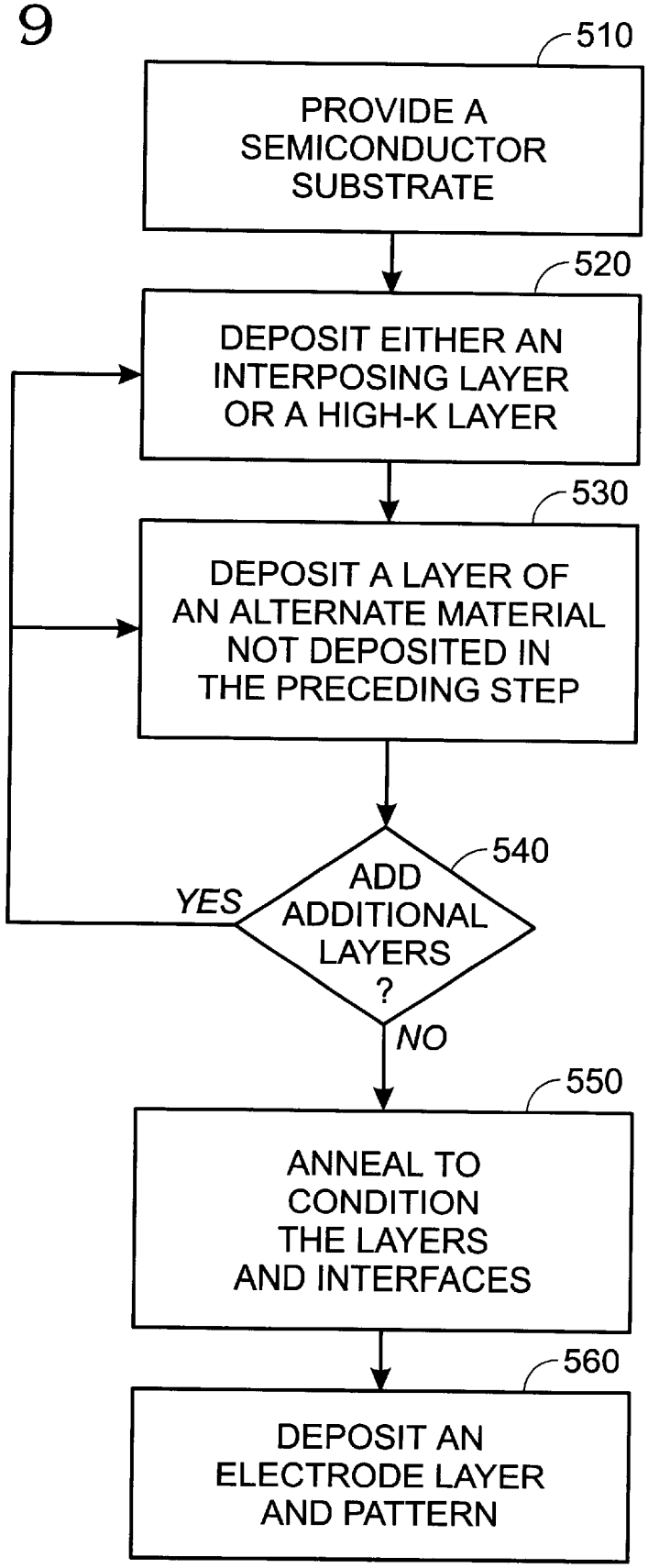
FIG. 9 is a flow chart summarizing the steps in the method of the present invention.

The steps in the method of the present invention are illustrated schematically in FIG. 9. The first step 510 is to provide a semiconductor substrate. In an alternative embodiment of the present invention, an oxidation barrier will also be provided overlying the semiconductor substrate.

Step 520 is the depositing of a thin layer of less than 50 Å of an interposing material, such as aluminum oxide ($Al_2O_3$), aluminum nitride (AlN), silicon nitride (SiN or $Si_3N_4$), or silicon dioxide ($SiO_2$) or a high-k material, such titanium oxide ($TiO_2$), zirconium oxide ($ZrO_2$), hafnium oxide ($HfO_2$), tantalum oxide ($Ta_2O_5$), or barium and strontium titanium oxide (($Ba,Sr)TiO_3$), but preferably $ZrO_2$, or $HfO_2$. Preferably, a thin layer of less than 35 angstroms will be deposited. Even thinner layers of less than 20 angstroms would be desirable.

Step 530 is the depositing of a thin layer of less than 50 Å an alternate material either the high-k material or the interposing material, whichever was not deposited in Step 520. Preferably, a thin layer of less than 35 angstroms will be deposited. Even thinner layers of less than 20 angstroms would be desirable.

In a preferred embodiment of the present invention, atomic layer deposition, also referred to as "pulsed CVD" or "atomic layer epitaxy", is used to deposit an extremely thin layer of material onto the substrate. Atomic layer deposition employs a chemical phenomenon known as chemisorption. In chemisorption, a material in a gas phase will adsorb to a surface saturating it, forming a monolayer. Most conventional deposition techniques employ physisorption processes, which produce multilayer deposition regions with a surface coverage that is purely statistical. By taking advantage of chemisorption, films can be grown that are extremely uniform in thickness and composition. For instance, zirconium oxide films have reportedly been grown this way on silicon by using zirconium chloride ($ZrCl_4$) to form the first monolayer, purging the system of $ZrCl_4$, and then exposing the surface to water vapor ($H_2O$). Other precursors for producing zirconium oxide layers include zirconium propoxide ($Zr(iOPr)_4$) and zirconium tetramethyl heptanedionato ($Zr(tmhd)_4$). Chemisorption occurs over a very limited range of temperature and pressures for a given gas-solid combination. For example, zirconium oxide has reportedly been deposited on silicon substrates at a temperature of 300 degrees Celsius using $ZrCl_4$ and $H_2O$. As the process produces a monolayer, thicker layers of zirconium oxide would be produced by adding additional monolayers. Once the desired thickness of high-k material is deposited, a layer of interposing material can be formed by depositing one or more monolayers until a desired thickness is reached. For instance, dimethyl aluminum hydride (DMAH) and $H_2O$ will be used to produce $Al_2O_3$. The general processes will need to be optimized, without undue experimentation, to utilize chemisorption in connection with selected precursors. The critical aspects of this deposition scheme are sufficient purging from one component prior to introduction of the next component, and the ability to control the temperature and pressure, which may be different for the high-k material and the interposing material. Atomic layer deposition makes it possible to produce layers of less than 10 angstroms thick, and preferably layers between approximately 2 and 5 angstroms thick. An efficient tool for preparing such ultrathin, atomic layers depositions on semiconductor substrates does not currently exist, although experimental depositions have demonstrated that atomic layer deposition is workable.

An alternative deposition technique using conventional systems is to sputter targets to lay down a thin layer of high-k or interposing material. Two sputtering targets of high purity metal are used. For example, one target of zirconium and one target of aluminum. Each target has its own shutter to control the deposition time. A wafer is prepared and placed into a deposition chamber. The wafer is then heated to a temperature between room temperature and 500 degrees Celsius. A mixture of argon (Ar) and oxygen ($O_2$) is then introduced into the deposition chamber. A plasma with a sputtering power of between approximately 500 W and 5 kW is produced within the chamber. The shutter for the aluminum target is preferably opened for between approximately 1 and 10 seconds to deposit aluminum over the wafer and then closed. After the aluminum target shutter is closed, the zirconium shutter is opened for between approximately 1 and 20 seconds to deposit zirconium over the wafer, and then closed. The presence of oxygen within the chamber will cause the target material to form an oxide concurrently with the deposition on the wafer, producing $AlO_2$ and $ZrO_2$ respectively. The steps could then be repeated as desired to produce a multiple layer dielectric stack such as $AlO_2/ZrO_2/AlO_2/ZrO_2/AlO_2/ZrO_2$.

In another alternative embodiment of the deposition method of the present invention, evaporation of targets is used to deposit the thin layer. The basic process is substantially identical to the description provided above with regard to sputtering, except that instead of exposing the targets to a plasma, the targets are heated to a temperature of between approximately 1,000 and 2,000 degrees Celsius. As described above, shutters can be used to control the duration of the deposition, and alternate between targets.

Although in the above examples, the interposing layer is deposited prior to the high-k layer, it would be within the scope of the present invention to deposit the high-k layer first. It is also within the scope of the present invention to produce an uneven number of layers such that the first layer and the last layer can be the same material, or the last layer can be a different material altogether.

Step 540 provides for the repetition of steps 520 and 530 until the desired number of layers are deposited. The deposition of each layer can be controlled by utilizing a shutter, or other means, to control the time of the deposition.

Step 550 is the annealing of the multilayer dielectric stack in either an inert atmosphere comprising argon, nitrogen or a mixture of nitrogen and hydrogen, or an oxidizing atmosphere comprising oxygen, water vapor, di-nitrogen oxide or nitrous oxide. The annealing is preferably performed at an elevated temperature of between 400 and 900 degrees Celsius to condition the high-k layers and the interposing layers as well as the interfaces between the various layers and the interface with the underlying silicon.

Step 560 is the depositing of an electrode and patterning of the electrode and the underlying multilayer dielectric stack. The patterning can be employed with either conventional patterning processes or substitute gate processes as desired.

Although the present invention is especially well suited for replacing silicon dioxide as the gate dielectric of a transistor, it would also be useful as a dielectric for storage capacitors, ferroelectric memory devices or other types of integrated circuits.

Alternative embodiments are possible within the scope of the present invention. As is clear from the illustrative examples, the invention can be practiced in a variety of configurations related to several different integrated circuit structures. Other variations of the method within the scope of the present invention will occur to those of ordinary skill in the art. Accordingly, the foregoing disclosure and description thereof are for illustrative purposes only and are not intended to limit the invention. This invention is defined by the claims.

What is claimed is:

1. A method of forming a dielectric stack comprising the steps of:
    a) forming a first dielectric layer on an upper surface of a semiconductor substrate, wherein the first dielectric layer comprises a first dielectric material, which is $HfO_2$;
    b) forming a second dielectric layer on the first dielectric layer, wherein the second dielectric layer is selected from the group consisting of $Al_2O_3$, AlN, SiN, and $Si_3N_4$; and
    c) forming a third dielectric layer above the second dielectric layer, wherein the third dielectric layer comprises the same dielectric material as the first dielectric material.

2. The method of claim 1, further comprising the step of annealing the semiconductor substrate at a temperature between approximately 400 and 900 degrees Celsius, whereby the dielectric stack is conditioned.

3. The method of claim 2, further comprising the step of depositing an electrode layer over the dielectric stack and the step of patterning the electrode layer and underlying dielectric stack to form a desired integrated circuit structure.

4. The method of claim 1, wherein the step of forming the first dielectric layer uses atomic layer deposition to deposit a layer of the first dielectric material.

5. The method of claim 4, wherein the step of forming the second dielectric layer uses atomic layer deposition to deposit a layer of the second dielectric material.

6. The method of claim 1, wherein the step of forming the first dielectric layer uses atomic layer deposition to deposit a first precursor of the first dielectric material.

7. The method of claim 6, further comprising the step of oxidizing the first precursor to form the first dielectric material.

8. The method of claim 6, wherein the first precursor is deposited as a self-limiting monolayer.

9. The method of claim 1, wherein the step of forming the first dielectric layer uses sputtering of a first target for a predetermined duration and the step of forming the second dielectric layer uses pulsed sputtering of a second target for a predetermined duration.

10. The method of claim 9, wherein the duration of sputtering the first target and the second target is controlled by shutters.

11. The method of claim 9, wherein sputtering is performed in an oxidizing atmosphere.

12. The method of claim 1, wherein the step of forming the first dielectric layer uses evaporation of a first target for a predetermined duration and the step of forming the second dielectric layer uses evaporation of a second target for a predetermined duration.

13. The method of claim 12, wherein the duration of evaporation of the first target and the second target is controlled by shutters.

* * * * *